US012684871B2

(12) United States Patent
Chang et al.

(10) Patent No.: US 12,684,871 B2
(45) Date of Patent: Jul. 14, 2026

(54) SHIELDED DEEP TRENCH CAPACITOR STRUCTURE AND METHODS OF FORMING THE SAME

(71) Applicant: Taiwan Semiconductor Manufacturing Company Limited, Hsinchu (TW)

(72) Inventors: Jen-Yuan Chang, Hsinchu City (TW); Chia-Ping Lai, Hsinchu City (TW); Chien-Chang Lee, Miaoli County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 370 days.

(21) Appl. No.: 18/359,343

(22) Filed: Jul. 26, 2023

(65) Prior Publication Data

US 2023/0378154 A1 Nov. 23, 2023

Related U.S. Application Data

(62) Division of application No. 17/394,489, filed on Aug. 5, 2021, now Pat. No. 12,094,868.

(51) Int. Cl.

| | |
|---|---|
| *H10D 86/85* | (2025.01) |
| *H10D 1/00* | (2025.01) |
| *H10D 1/68* | (2025.01) |
| *H10W 42/20* | (2026.01) |
| *H10W 70/685* | (2026.01) |
| *H10W 90/00* | (2026.01) |

(52) U.S. Cl.
CPC ............. *H10D 86/85* (2025.01); *H10D 1/042* (2025.01); *H10D 1/716* (2025.01); *H10W 42/20* (2026.01); *H10W 70/685* (2026.01); *H10W 90/00* (2026.01); *H10W 90/701* (2026.01)

(58) Field of Classification Search
CPC ........ H10D 86/85; H10D 1/042; H10D 1/716; H01L 23/49816; H01L 23/49822; H01L 23/552; H01L 25/18; H10W 42/20; H10W 70/685; H10W 90/00; H10W 90/701
See application file for complete search history.

(56) References Cited

U.S. PATENT DOCUMENTS

| | | | |
|---|---|---|---|
| 2005/0189614 A1* | 9/2005 | Ihme ................... | H10D 84/212 |
| | | | 257/532 |
| 2018/0076134 A1* | 3/2018 | Jing ................... | H01L 23/5225 |

(Continued)

*Primary Examiner* — Benjamin Tzu-Hung Liu
(74) *Attorney, Agent, or Firm* — The Marbury Law Group, PLLC

(57) ABSTRACT

A moat trench laterally surrounding a device region is formed in a substrate. A conductive metallic substrate enclosure structure is formed in the moat trench. Deep trenches are formed in the substrate, and a trench capacitor structure is formed in the deep trenches. The substrate may be thinned by removing a backside portion of the substrate. A backside surface of the conductive metallic substrate enclosure structure is physically exposed. A backside metal layer is formed on a backside surface of the substrate and a backside surface of the conductive metallic substrate enclosure structure. A metallic interconnect enclosure structure and a metallic cap plate may be formed to provide a metallic shield structure configured to block electromagnetic radiation from impinging into the trench capacitor structure.

20 Claims, 15 Drawing Sheets

(56)     References Cited

U.S. PATENT DOCUMENTS

2019/0393153 A1 *  12/2019  Wang ................ H01L 21/76898
2020/0402892 A1 *  12/2020  Chen ....................... H10P 72/74
2022/0084928 A1 *   3/2022  Chen ................... H10W 70/635
2022/0384308 A1 *  12/2022  Lee ....................... H10W 20/20

* cited by examiner

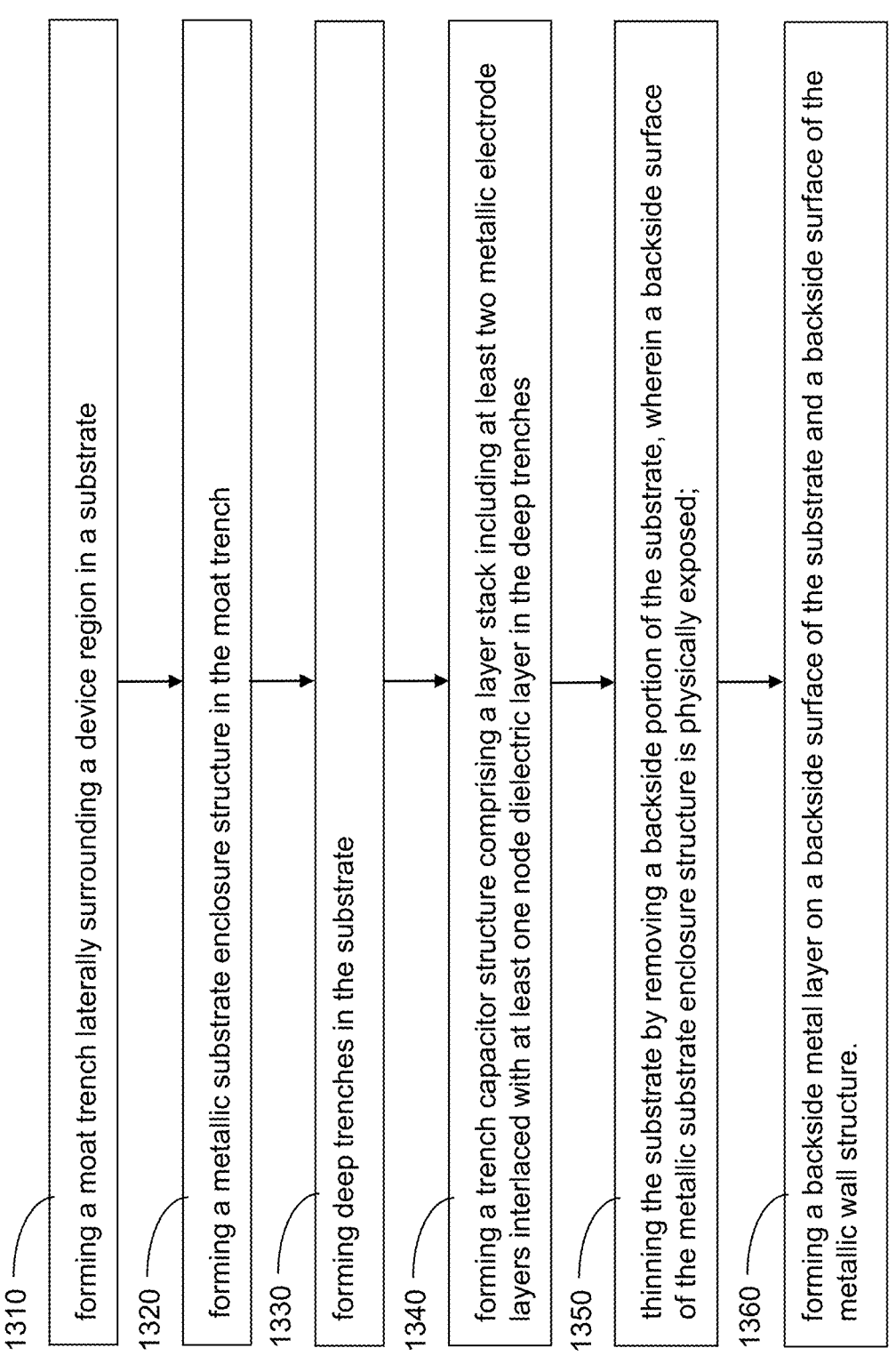

1310 — forming a moat trench laterally surrounding a device region in a substrate 1320 — forming a metallic substrate enclosure structure in the moat trench 1330 — forming deep trenches in the substrate 1340 — forming a trench capacitor structure comprising a layer stack including at least two metallic electrode layers interlaced with at least one node dielectric layer in the deep trenches 1350 — thinning the substrate by removing a backside portion of the substrate, wherein a backside surface of the metallic substrate enclosure structure is physically exposed;

1360 — forming a backside metal layer on a backside surface of the substrate and a backside surface of the metallic wall structure.

FIG. 13

SHIELDED DEEP TRENCH CAPACITOR STRUCTURE AND METHODS OF FORMING THE SAME

This application is a divisional application of U.S. application Ser. No. 17/394,489 entitled "Shielded Deep Trench Capacitor Structure and Methods of Forming the Same," filed on Aug. 5, 2021, the entire contents of which are incorporated herein by reference for all purposes.

BACKGROUND

Deep trench capacitors are used in semiconductor chips for many applications such as power supply stabilization. Deep trench capacitors may provide high capacitance while possessing a small device footprint.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 is a flowchart that illustrates the general processing steps of the methods of the present disclosure.

DETAILED DESCRIPTION

Figures 1A, 1B:
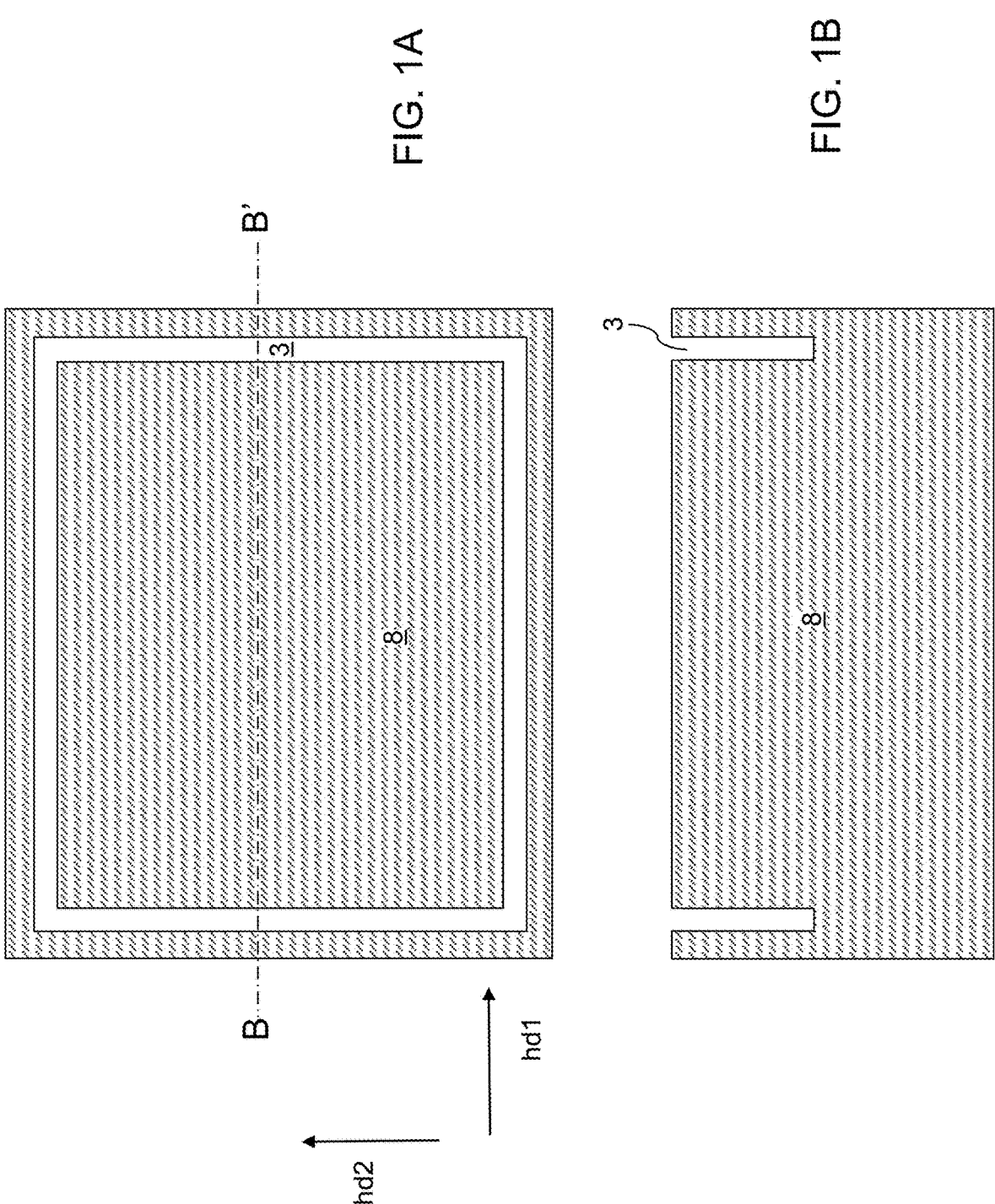
FIG. 1A is a top-down view of an exemplary structure after formation of a moat trench in a capacitor die according to an embodiment of the present disclosure.
FIG. 1B is a vertical cross-sectional view of the exemplary structure along the vertical plane B-B' of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to an electromagnetic field-shielded deep trench capacitor structure and methods of forming the same. An external electromagnetic wave may induce electrical charges in an outer electrode of a deep trench capacitor. Such induced charges may cause fluctuations in the output voltage provided by the deep trench capacitor. The structures and methods of the present disclosure may be used to reduce or eliminate adverse impacts of such external electromagnetic radiation on the stability of the output voltage from a deep trench capacitor, the various aspects of which are described herebelow.

Referring to FIGS. 1A and 1B, an exemplary structure according to an embodiment of the present disclosure is illustrated. The exemplary structure includes a substrate 8 having a planar top surface. The substrate 8 may be a semiconductor substrate including a semiconductor material, and may have a thickness of at least 10 microns. In one embodiment, the substrate 8 may include a commercially available semiconductor wafer that may be diced into semiconductor dies after formation of deep trenches. For example, the substrate 8 may include a semiconductor substrate including single crystalline silicon and having a thickness in a range from 500 microns to 1,500 microns, although thicker or thinner substrates may be used. The diameter of the substrate 8 may be in a range from 100 mm to 450 mm, although lesser and greater diameters may also be used. A two-dimensional array of semiconductor dies may be formed in the substrate 8.

A moat trench 3 may be formed around a periphery of each semiconductor die. Each moat trench 3 may laterally surround a device region, in which a capacitor structure may be subsequently formed. Each moat trench 3 may be laterally offset inward by a lateral offset distance from a boundary of a respective semiconductor die, which is a capacitor die in which a respective trench capacitor structure is subsequently formed. The moat trench 3 may have a depth that is greater than the depth of deep trenches to be subsequently formed within the area of the moat trench 3. For example, a photoresist layer (not shown) or a patterned etch mask layer (such as a patterned hard mask layer) may be formed above a front surface of the substrate 8 such that an annular opening is formed along a periphery of the semiconductor die. An anisotropic etch process may be performed to transfer the pattern of an annular opening (i.e., a ring-shaped opening) in the photoresist layer or the patterned etch mask layer into an upper portion of the substrate 8. In one embodiment, the moat trench 3 may have a horizontal cross-sectional shape of a rectangular frame. The width of the moat trench 3 (as measured between an inner sidewall and an outer sidewall) may be in a range from 0.3 microns to 10 microns, such as from 1 micron to 5 microns, although lesser and greater widths may also be used. The depth of the moat trench 3 may be in a range from 5 microns to 30 microns, although lesser and greater depths may also be used.

Figures 2A, 2B:
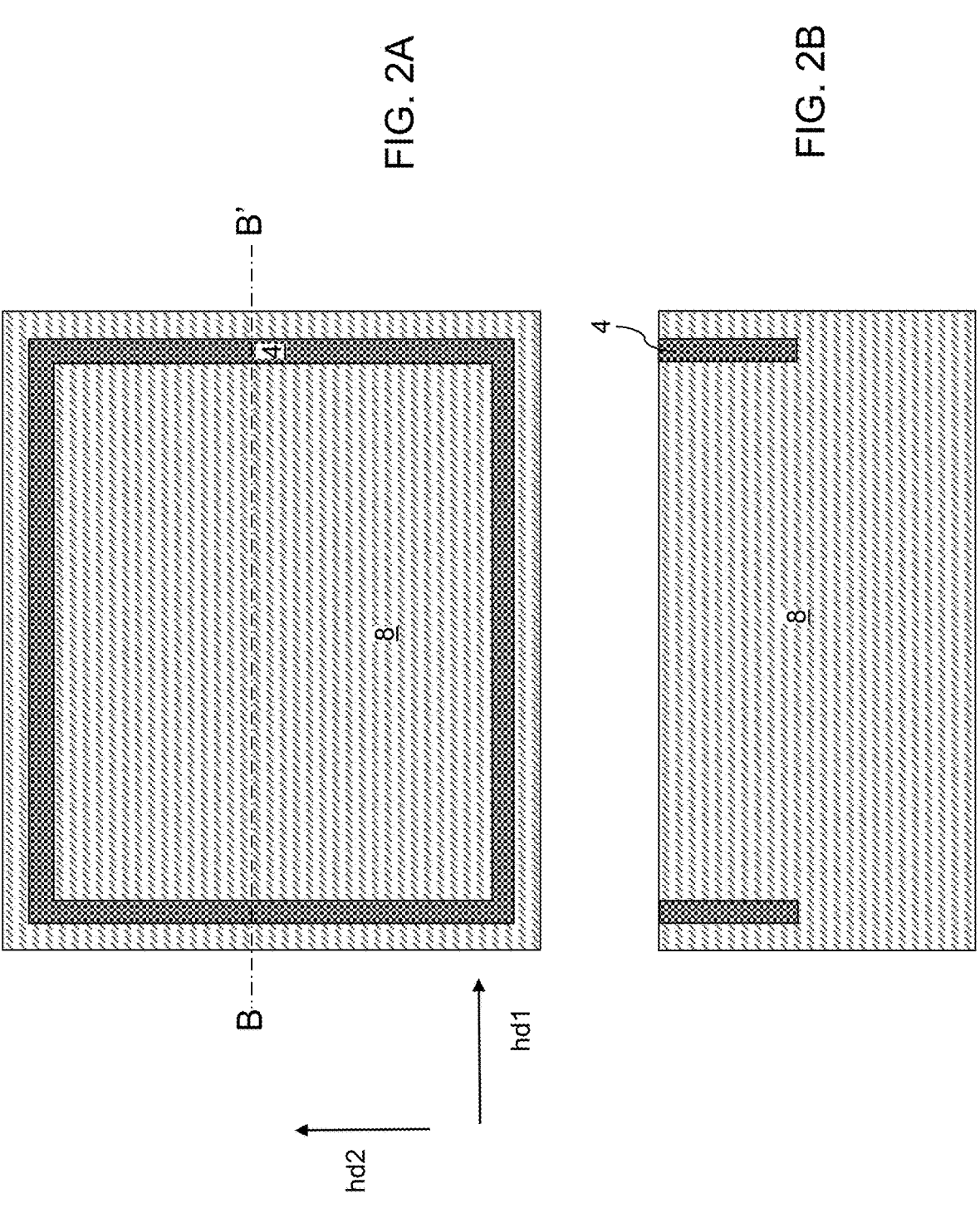
FIG. 2A is a top-down view of the exemplary structure after formation of a conductive metallic substrate enclosure structure according to an embodiment of the present disclosure.
FIG. 2B is a vertical cross-sectional view of the exemplary structure along the vertical plane B-B' of FIG. 2A.

Referring to FIGS. 2A and 2B, at least one conductive material may be deposited in each moat trench 3. The at least one conductive material may include at least one metallic material and/or at least one heavily doped conductive semiconductor material, i.e., a semiconductor material having electrical conductivity greater than $1.0 \times 10^5$ S/cm. In one embodiment, the at least one conductive material may include a conductive metallic nitride material (such as TiN, TaN, and/or WN) and a metallic fill material (such as Cu, Co, Ru, W, Mo, etc.). Other suitable metallic nitride materials and metallic fill materials may be within the contemplated scope of disclosure. For example, a metallic nitride liner having a thickness in a range from 10 nm to 100 nm may be deposited in each moat trench 3, and the remaining volume of each moat trench 3 may be filled with the metallic fill material. Excess portions of the at least one conductive material may be removed from above the horizontal plane including the front surface of the substrate 8 by a planarization process such as a chemical mechanical planarization (CMP) process. A remaining portion of the at least one conductive material filling a moat trench 3 constitutes a conductive metallic substrate enclosure structure 4. In one embodiment, the conductive metallic substrate enclosure structure 4 may include, and/or may consist essentially of, at least one metallic material. In this embodiment, the conductive metallic substrate enclosure structure 4 may be a metallic substrate enclosure structure. The conductive metallic substrate enclosure structure 4 laterally surrounds, and laterally encloses, a region of an upper portion of the substrate 8. The inner sidewalls and the outer sidewalls of the conductive metallic substrate enclosure structure 4 may be vertical or tapered. In embodiments in which the inner sidewalls and the outer sidewalls of the conductive metallic substrate enclosure structure 4 are tapered, the conductive metallic substrate enclosure structure 4 may have a greater width within a horizontal plane including the top surface of the substrate 8 than within a horizontal plane including an annular bottom surface of the conductive metallic substrate enclosure structure 4.

Figure 3A:
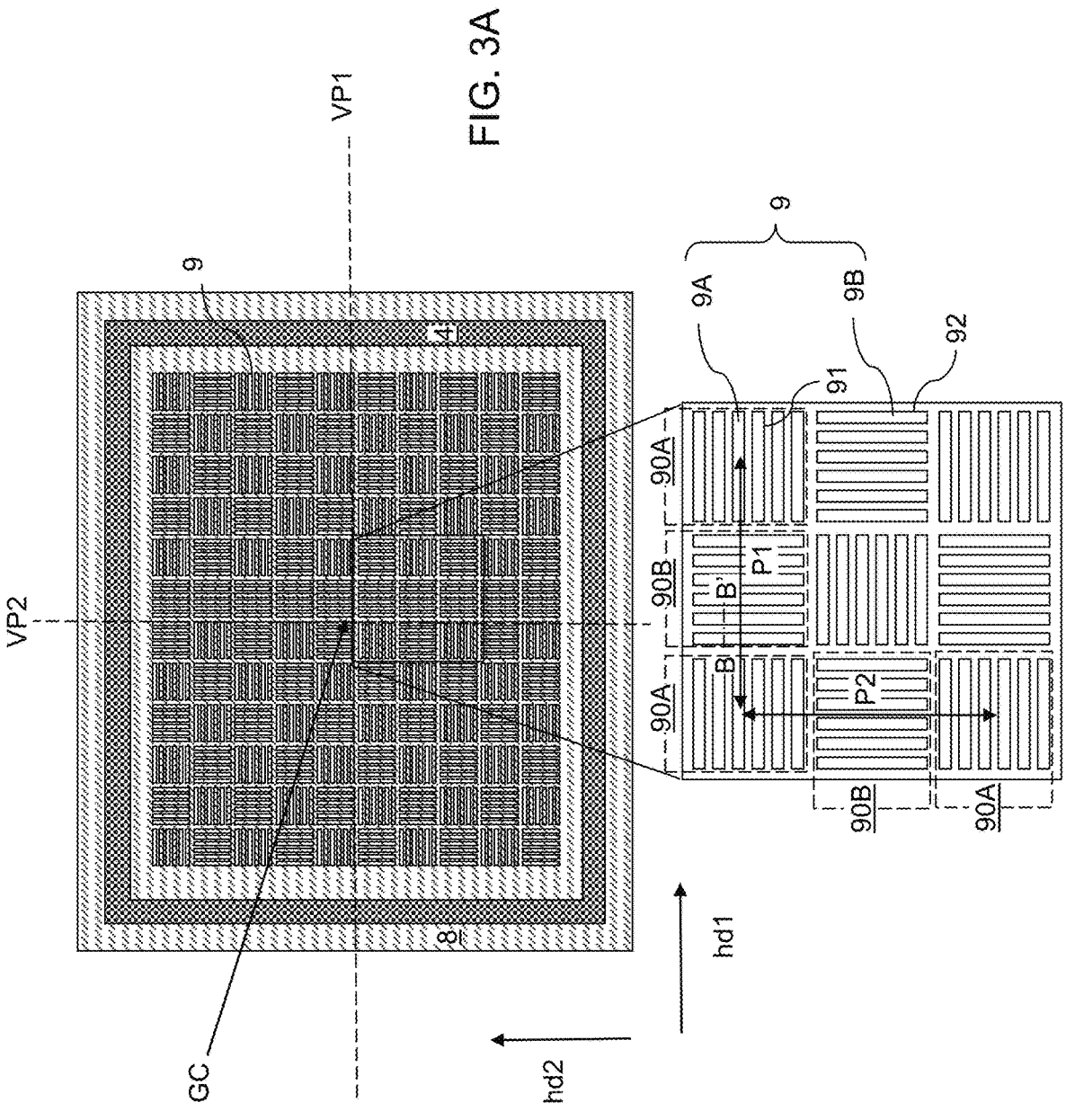
FIG. 3A is a vertical cross-sectional view of the exemplary structure after formation of deep trenches in the substrate according to an embodiment of the present disclosure. An inset illustrates a magnified view of a region of the exemplary structure.
Figure 3B:
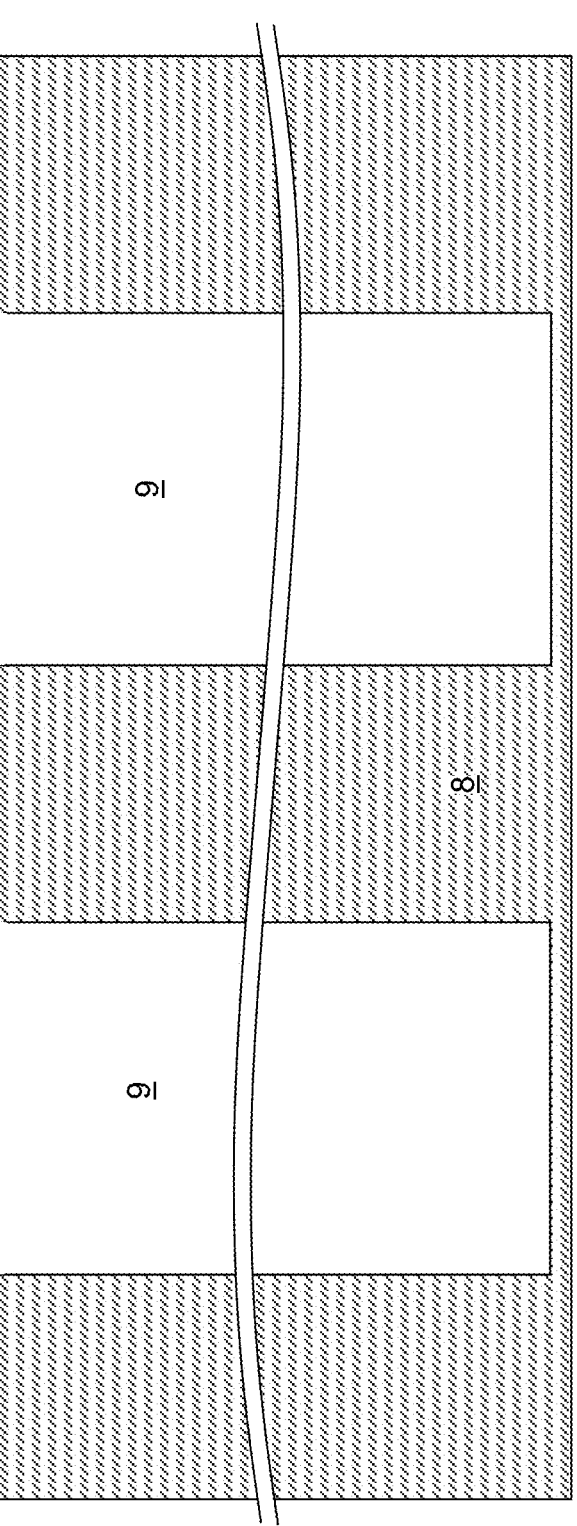
FIG. 3B is a vertical cross-sectional view of a region of the exemplary structure along the vertical plane B-B' of FIG. 3A.

Referring to FIGS. 3A and 3B, deep trenches 9 extending downward from a front surface of a substrate 8 toward a backside surface of the substrate 8 may be formed. FIG. 3A shows a first vertical plane VP1 that is parallel to the first horizontal direction hd1, a second vertical plane VP2 that is parallel to the second horizontal direction hd2, and a geometrical center GC of the exemplary structure located at the intersection of the first vertical plane VP1 and the second vertical plane VP2. For example, a patterned etch mask layer may be formed on the front surface of the substrate 8. The pattern in the patterned etch mask layer may be transferred into an upper portion of the substrate 8. An optional pad dielectric layer (not shown) such as a silicon oxide pad layer may be formed on the front surface, i.e., the top surface, of the substrate 8 prior to formation of the patterned etch mask layer. In an exemplary embodiment, the pad dielectric layer may include a silicon oxide layer having a thickness in a range from 20 nm to 100 nm, although thicker or thinner pad dielectric layers may be used. The patterned etch mask layer may include a silicon nitride layer or a borosilicate glass (BSG) layer having a thickness in a range from 200 nm to 600 nm, although different materials and/or lesser or greater thicknesses may also be used for the optional pad dielectric layer and the patterned etch mask layer. The patterned etch mask layer may be formed by depositing a blanket etch mask layer. Then, a lithographically patterned photoresist layer may be formed over the blanket etch mask layer. The pattern in the lithographically patterned photoresist layer may be transferred through the blanket etch mask layer using an anisotropic etch process such as a reactive ion etch process.

An anisotropic etch process may be performed to transfer the pattern in the patterned etch mask layer through an upper portion of the substrate 8 to form the deep trenches 9. For example, a reactive ion etch process using a combination of gases including HBr, $NF_3$, $O_2$, and $SF_6$ may be used to form the deep trenches 9. The depth of the deep trenches 9 may be in a range from 2 micron to 20 microns, such as from 3 microns to 10 microns, although deeper or shallower trenches may be used. The horizontal cross-sectional shape of each deep trench 9 may have a shape of a circle, an ellipse, a rectangle, a rounded rectangle, an annulus having an inner periphery and an outer periphery of various shapes, or of any two-dimensional shape that defines an enclosed volume. Generally, at least one deep trench 9 extending downward from a top surface of the substrate may be formed in the substrate 8. The at least one deep trench 9 may comprise a plurality of deep trenches 9 having a depth that is greater than 2 microns. Each deep trench 9 may be formed within a respective device area that is laterally surrounded by a respective conductive metallic substrate enclosure structure 4.

In one embodiment, each of the deep trenches 9 may be laterally elongated with a uniform width. A predominant portion (such as more than 50% of the entire area) of each deep trench 9 may have a width that is sufficient to accommodate vertically-extending portions of all metallic electrode layers and at least two node dielectric layers to be subsequently formed. For example, a predominant portion of each deep trench 9 may have a width that is sufficient to accommodate vertically-extending portions of at least three metallic electrode layers and at least two node dielectric layers. In an illustrative example, a predominant portion of each deep trench 9 may have a width that is in a range from 50 nm to 1,000 nm, although lesser and greater widths may also be used.

In one embodiment, first-type deep trenches 9A and second-type deep trenches 9B may be formed into an upper portion of the substrate 8. The first-type deep trenches 9A may have first lengthwise sidewalls 91 that laterally extend along a first horizontal direction hd1 and the second-type deep trenches 9B may have second lengthwise sidewalls 92 that laterally extend along a second horizontal direction hd2 that is different from the first horizontal direction hd1. In one embodiment, the second horizontal direction hd2 may be perpendicular to the first horizontal direction hd1.

In one embodiment, each of the first-type deep trenches 9A and the second-type deep trenches 9B may have a length-to-width ratio in a range from 3 to 30. In one embodiment, each of the first-type deep trenches 9A and the second-type deep trenches 9B has a depth-to-width ratio in a range from 10 to 200. In one embodiment, each of the first-type deep trenches 9A and the second-type deep trenches 9B has a depth in a range from 2 micron to 20 microns. Generally, the depth of the deep trenches 9 is less than the height of the conductive metallic substrate enclosure structure 4.

In one embodiment, clusters 90A that are subsets of the first-type deep trenches 9A and clusters 90B that are subsets of the second-type deep trenches 9B may laterally alternate along at least one direction that is selected from the first horizontal direction hd1 and the second horizontal direction hd2. The second horizontal direction hd2 may be perpendicular to the first horizontal direction hd1. In one embodiment, the clusters 90A that are subsets of the first-type deep trenches 9A and clusters 90B that are subsets of the second-type deep trenches 9B may laterally alternate along the first horizontal direction hd1 and along the second horizontal direction hd2. In the illustrated example, each cluster of a subset of the first-type deep trenches 9A may include six first-type deep trenches 9A, and each cluster of a subset of the second-type deep trenches 9B may include six second-type deep trenches 9B.

In one embodiment, the first-type deep trenches 9A and the second-type deep trenches 9B may comprise a two-dimensional array of deep trenches 9 in which the first-type deep trenches 9A are arranged as a first two-dimensional periodic array and the second-type deep trenches 9B are arranged as a second two-dimensional periodic array that is interlaced with the first two-dimensional periodic array. In one embodiment, each of the first two-dimensional periodic array and the second two-dimensional periodic array has a first periodic pitch P1 along the first horizontal direction hd1 and has a second periodic pitch P2 along the second horizontal direction hd2. In one embodiment, the second two-dimensional periodic array may be laterally offset along the first horizontal direction hd1 by one half of the first periodic pitch P1, and may be laterally offset along the second horizontal direction hd2 by one half of the second periodic pitch P2.

The photoresist layer may be removed prior to the anisotropic etch process that forms the deep trenches 9, or may be consumed during the anisotropic etch process that forms the deep trenches 9. The patterned etch mask layer and the optional dielectric pad layer may be subsequently removed, for example, by a respective isotropic etch process such as a wet etch process.

Figure 4:
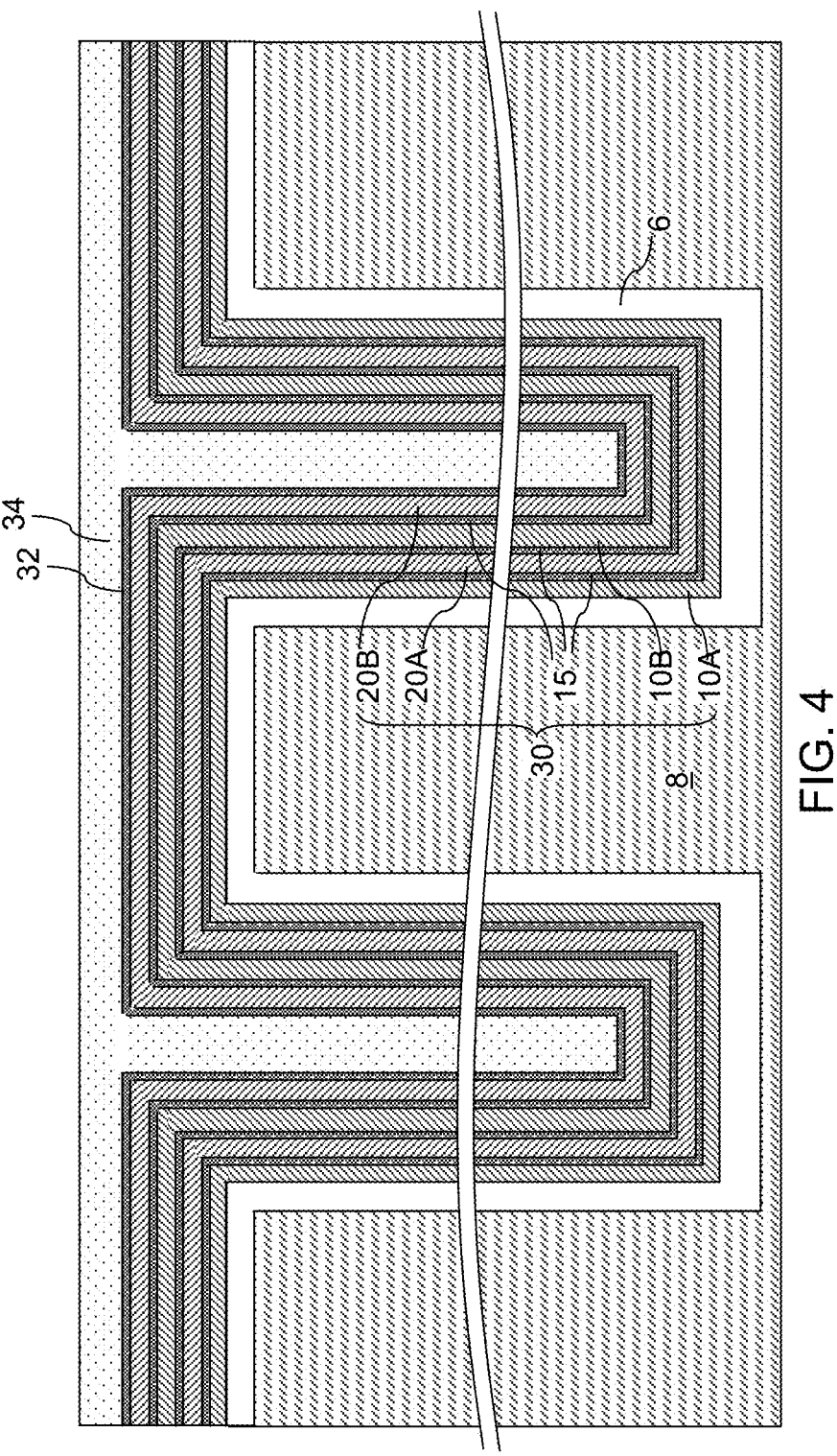
FIG. 4 is a vertical cross-sectional view of a region of the exemplary structure after formation of a layer stack including at least three metallic electrode layers interlaced with at least two node dielectric layers according to an embodiment of the present disclosure.

Referring to FIG. 4, a dielectric liner 6 may be formed on the physically exposed surface of the semiconductor substrate 8 including the top surface of the semiconductor substrate 8 and sidewalls of the deep trenches 9. The dielectric liner 6 may include a dielectric material that provides electrical isolation between the deep trench capacitors to be subsequently formed and the substrate 8. For example, the dielectric liner 6 may include silicon oxide, silicon nitride, silicon oxynitride, and/or a dielectric metal oxide. Other suitable dielectric liner materials within the contemplated scope of disclosure may also be used. In an illustrative example, the dielectric liner 6 may include a silicon oxide layer formed by thermal oxidation of surface portions of the substrate 8 that includes silicon. The thickness of the dielectric liner 6 may be in a range from 4 nm to 100 nm, although lesser and greater thicknesses may also be used.

An alternating layer stack 30 of metallic electrode layers (10A, 20A, 10B, 20B) and node dielectric layers 15 may be formed by a respective conformal deposition process. The alternating layer stack 30 includes at least three metallic electrode layers (e.g., 10A, 20A, 10B, 20B) interlaced with at least two node dielectric layers 15, and continuously extending over the top surface of the semiconductor substrate 8 and into each of the at least one deep trench 9. The alternating layer stack 30 may continuously extend into each deep trench 9. A cavity may be present in an unfilled volume of each the deep trench 9. Generally, the at least three metallic electrode layers (10A, 20A, 10B, 20B) and the at least two node dielectric layers 15 are deposited by a respective conformal deposition process.

Each of the metallic electrode layers (10A, 20A, 10B, 20B) may include a metallic material, which may comprise, and/or consist essentially of, a conductive metallic nitride, an elemental metal, or an intermetallic alloy. In one embodiment, each metallic electrode layer (10A, 20A, 10B, 20B) comprises, and/or consists essentially of, a conductive metallic nitride material, which may be a metallic diffusion barrier material. For example, each metallic electrode layer (10A, 20A, 10B, 20B) may include, and/or may consist essentially of, a conductive metallic nitride material such as TiN, TaN, or WN. Other suitable materials within the contemplated scope of disclosure may also be used.

Use of a metallic diffusion barrier material for the metallic electrode layers (10A, 20A, 10B, 20B) may be advantageous because diffusion of metallic elements through the node dielectric layers 15 and/or through the dielectric liner 6 may cause deleterious effects for deep trench capacitors. Each metallic electrode layer (10A, 20A, 10B, 20B) may be formed by a conformal deposition process such as chemical vapor deposition (CVD) or atomic layer deposition (ALD). The thickness of each metallic electrode layer (10A, 20A, 10B, 20B) may be in a range from 5 nm to 50 nm, such as from 10 nm to 30 nm, although lesser and greater thicknesses may also be used. In one embodiment, each metallic electrode layer (10A, 20A, 10B, 20B) may have the same material composition and the same thickness. In another embodiment, each metallic electrode layer (10A, 20A, 10B, 20B) may have the same material composition but have varying thicknesses. In yet another embodiment, each metallic electrode layer (10A, 20A, 10B, 20B) may have different material composition and the same thickness. In yet another embodiment, each metallic electrode layer (10A, 20A, 10B, 20B) may have different material composition and different thicknesses.

Each of node dielectric layers 15 may include a node dielectric material, which may be a dielectric metal oxide material having a dielectric constant greater than 7.9 (which is the dielectric constant of silicon nitride), i.e., a "high-k" dielectric metal oxide material, or may include silicon nitride. For example, the node dielectric layer 15 may include a dielectric metal oxide material such as aluminum oxide, hafnium oxide, zirconium oxide, tantalum oxide, lanthanum oxide, an alloy or a silicate thereof, and/or a layer stack thereof. In one embodiment, the node dielectric layer 15 may include amorphous aluminum oxide layer that may be subsequently annealed into polycrystalline aluminum oxide material after formation of contact via structures. Other suitable materials within the contemplated scope of disclosure may also be used.

Each node dielectric layer 15 may be formed by a conformal deposition process such as chemical vapor deposition (CVD) or atomic layer deposition (ALD). The thickness of each node dielectric layer 15 may be in a range from 1 nm to 20 nm, such as from 3 nm to 12 nm, although lesser and greater thicknesses may also be used. In one embodiment, each node dielectric layer 15 may have the same material composition and the same thickness. In another embodiment, each node dielectric layer 15 may have the same material composition but have varying thicknesses. In yet another embodiment, each node dielectric layer 15 may have different material composition and the same thickness. In yet another embodiment, each node dielectric layer 15 may have different material composition and different thicknesses. For example, in an embodiment, a first node dielectric layer 15 may be thinner than a second node dielectric layer 15.

The total number of the metallic electrode layers (10A, 20A, 10B, 20B) may be in a range from 3 to 16, such as from 4 to 8. The total number of the node dielectric layers 15 may be one less than the total number of the metallic electrode layers (10A, 20A, 10B, 20B).

While the present disclosure is described using an embodiment in which the alternating layer stack 30 of the metallic electrode layers (10A, 20A, 10B, 20B) and the node dielectric layers 15 include four metallic electrode layers (10A, 20A, 10B, 20B) and three node dielectric layers 15, embodiments are expressly contemplated herein in which different numbers of metallic electrode layers (10A, 20A, 10B, 20B) and different numbers of node dielectric layers 15 may be used within the alternating layer stack 30. Generally, an alternating layer stack 30 may include at least three metallic electrode layers (10A, 20A, 10B, 20B) interlaced with at least two node dielectric layers 15 that may be formed in, and over, at least one deep trench 9 formed in a substrate 8.

The metallic electrode layers (10A, 20A, 10B, 20B) may be sequentially numbered in the order of deposition. For example, the metallic electrode layers (10A, 20A, 10B, 20B) may include a first metallic electrode layer 10A, a second metallic electrode layer 20A, a third metallic electrode layer 10B, a fourth metallic electrode layer 20B, etc. Patterned portions of each odd-numbered metallic electrode layer (10A, 10B) may be subsequently used to form a primary electrode assembly that functions as a primary node, i.e., a first node, of a deep trench capacitor, and patterned portions of each even-numbered metallic electrode layer (20A, 20B) may be subsequently used to form a complementary electrode assembly that functions as a complementary node, i.e., a second node, of the deep trench capacitor. The total number of the metallic electrode layers (10A, 20A, 10B, 20B), the thicknesses of the metallic electrode layers (10A, 20A, 10B, 20B), and the width of the deep trenches 9 may be selected such that a predominant portion (i.e., more than 50%) of the entire volume of each deep trench 9 may be filled with the alternating layer stack 30 without completely filling the deep trench 9.

A capping dielectric material layer 32 and a dielectric fill material layer 34 may be optionally deposited over the alternating layer stack 30. The capping dielectric material layer 32 may include a same dielectric material as the node dielectric layers 15, and may have a thickness in a range from 1 nm to 20 nm, such as from 3 nm to 12 nm, although lesser and greater thicknesses may also be used.

The dielectric fill material layer 34 may be deposited on the capping dielectric material layer 32 or on the alternating layer stack 30 to fill the volumes of cavities that remain in the deep trenches 9. In one embodiment, the dielectric fill material layer 34 comprises, and/or consists essentially of, undoped silicate glass or a doped silicate glass.

Figure 5:
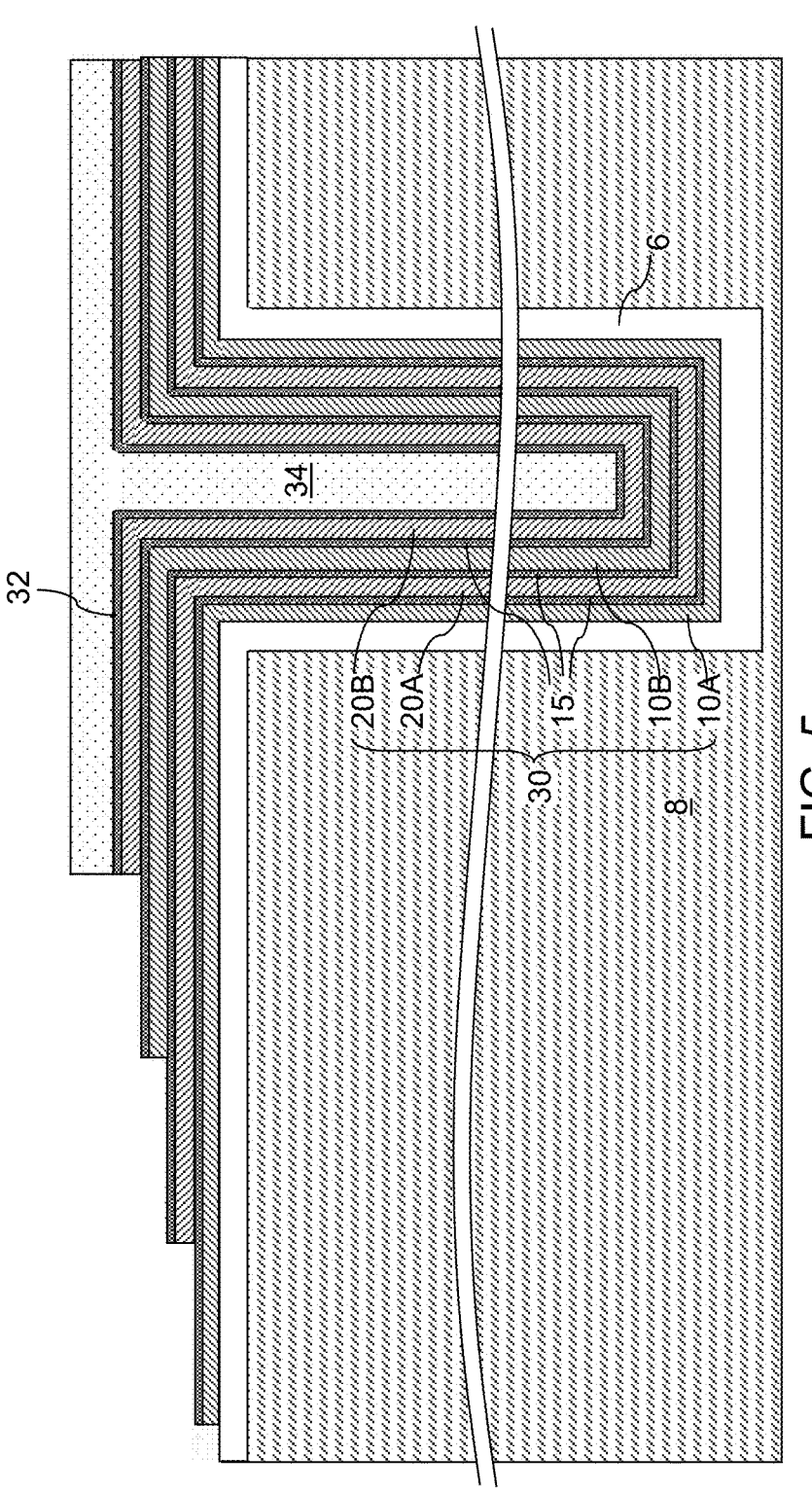
FIG. 5 is a vertical cross-sectional view of a peripheral region of the exemplary structure after patterning the layer stack according to an embodiment of the present disclosure.

Referring to FIG. 5, a trimmable mask layer may be applied over the dielectric fill material layer 34. The trimmable mask layer may be lithographically patterned to cover the area of the deep trenches 9. The entire periphery of the trimmable mask layer may be located outside the area of the deep trenches 9. A first set of etch processes may be performed to etch unmasked portions of the dielectric fill material layer 34, the optional capping dielectric material layer 32, and the topmost layer selected from the metallic electrode layers (10A, 10B, 20A, 20B). The first set of etch processes may include a set of wet etch processes.

Subsequently, the trimmable mask layer may be trimmed to laterally recess the periphery of the trimmable mask layer and to increase the area unmasked by the trimmable mask layer. A second set of etch processes may be performed to etch unmasked portions of the dielectric fill material layer 34, the optional capping dielectric material layer 32, unmasked portions of the topmost one of the node dielectric layers 15, and unmasked underlying portions of the metallic electrode layers (10A, 10B, 20A, 20B).

The trimming of the trimmable mask layer and additional sets of etch processes may be repeated to provide stepped surfaces for the metallic electrode layers (10A, 10B, 20A, 20B). The trimmable mask layer may be subsequently removed, for example, by ashing or by dissolution in a solvent. Thus, a trench capacitor structure may be formed. The trench capacitor structure may include a layer stack including at least two metallic electrode layers (10A, 10B, 20A, 20B) interlaced with at least one node dielectric layer 15. Each layer within the layer stack comprises a horizontally-extending portion that overlies a front surface of the substrate 8 and vertically-extending portions located within a respective one of the deep trenches 9.

Figure 6:
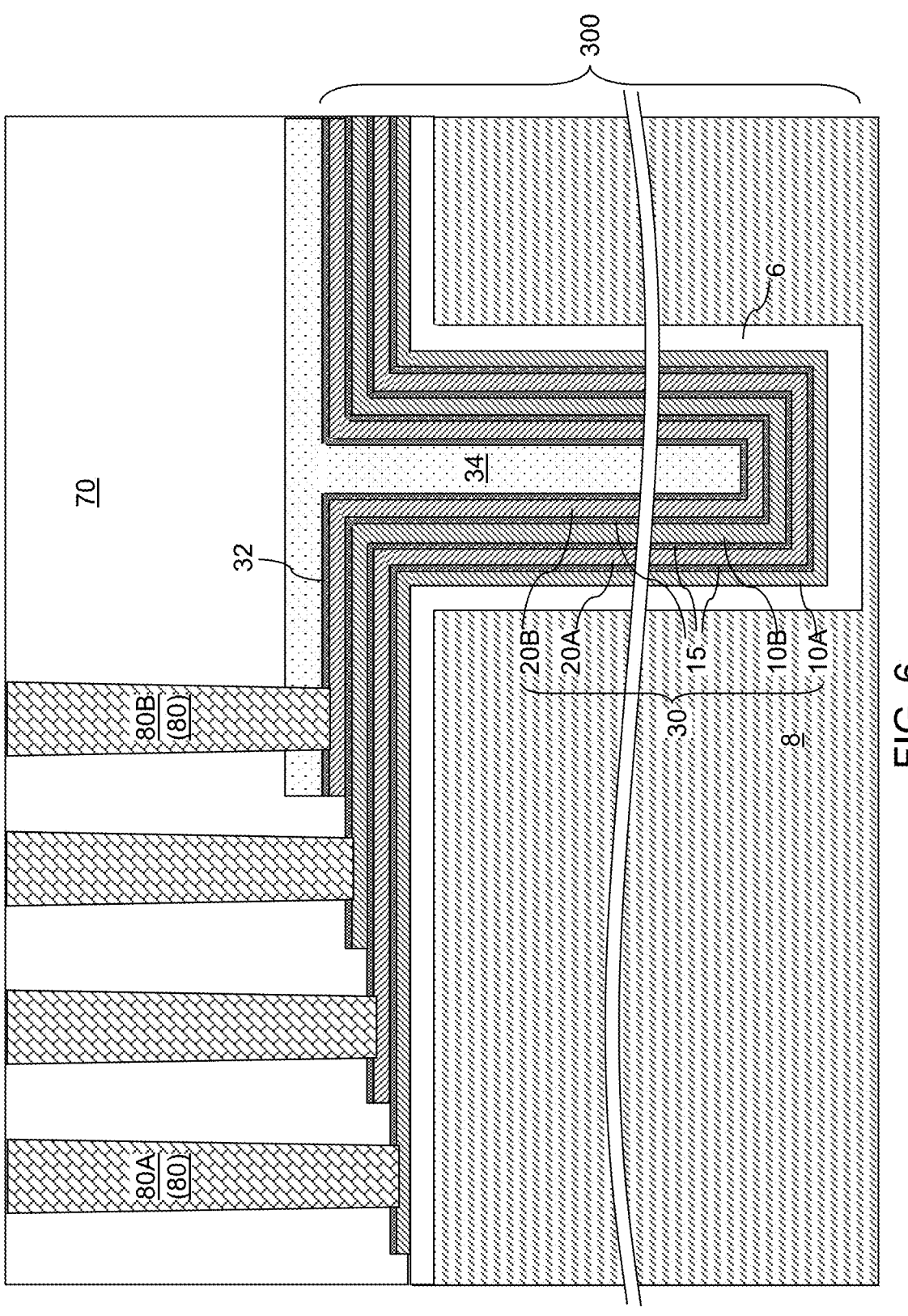
FIG. 6 is a vertical cross-sectional view of a region of the exemplary structure after formation of a contact-level dielectric layer and contact via structures according to an embodiment of the present disclosure.
Figures 7A, 7B:
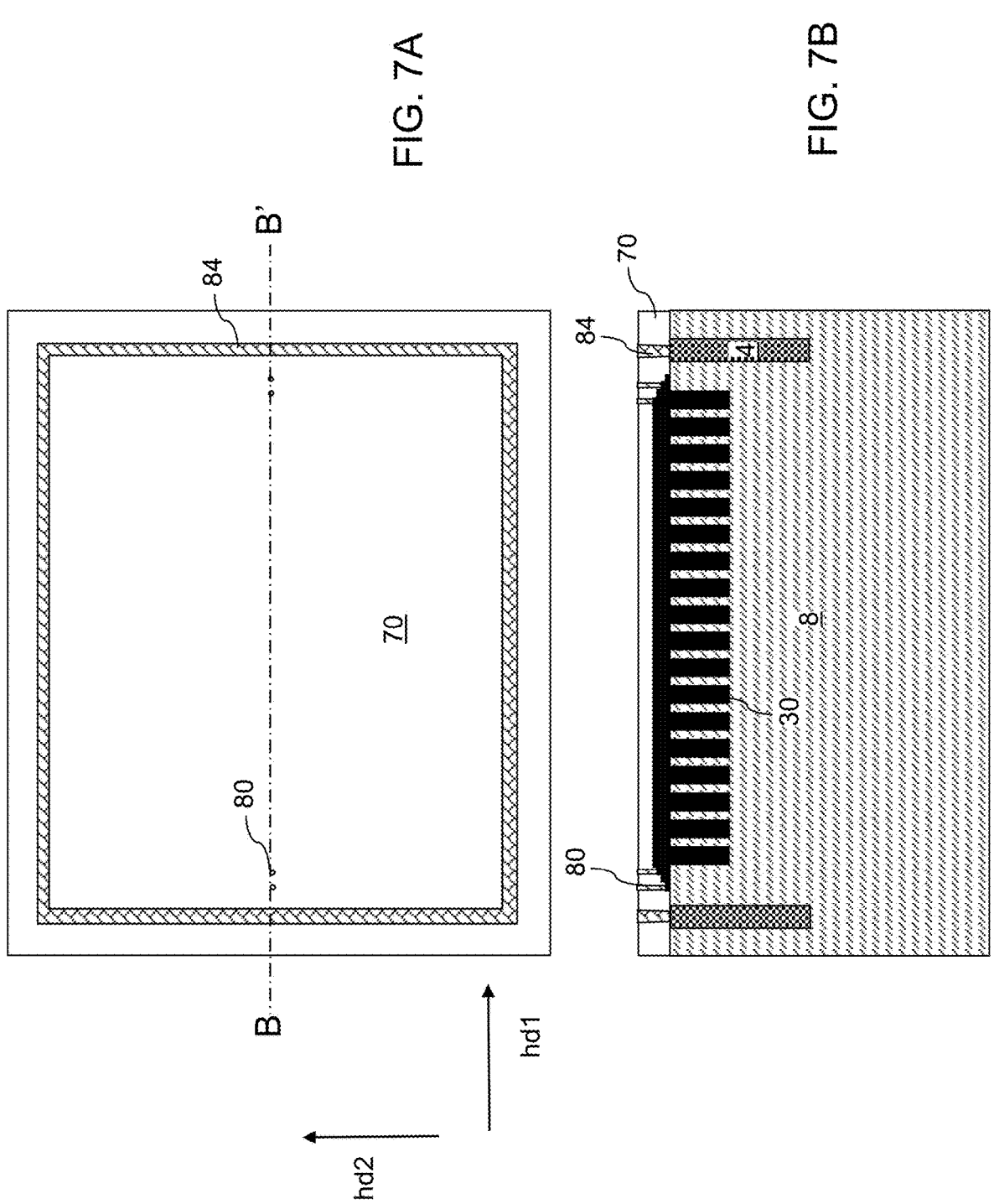
FIG. 7A is a top-down view of the exemplary structure at the processing steps of FIG. 6.
FIG. 7B is a vertical cross-sectional view of the exemplary structure along the vertical plane B-B' of FIG. 7A.

Referring to FIGS. 6, 7A, and 7B, a planarizable dielectric material or a self-planarizing dielectric material may be deposited over the alternating layer stack (10A, 10B, 20A, 20B) and the dielectric fill material layer 34 to form a first dielectric material layer 70 that may be a layer that surrounds the contact-level metallic structures connected to the alternating stack (sometimes referred to as a contact-level dielectric layer 70). The first dielectric layer 70 may be formed over the front surface of the substrate 8, and may have a thickness in a range from 100 nm to 2,000 nm, although lesser and greater thicknesses may also be used.

Contact-level metallic structures (80, 84) may be formed through the first dielectric layer 70. The contact-level metallic structures (80, 84) may include contact via structures 80 and a contact-level metallic enclosure structure 84. The contact via structures 80 may be formed through the first dielectric layer 70 on a respective one of the metallic electrode layers (10A, 10B, 20A, 20B). Each of the at least three metallic electrode layers (10A, 10B, 20A, 20B) may be contacted by a respective contact via structure 80 embedded within the first dielectric layer 70, which overlies the horizontally-extending portion of the dielectric fill material layer 34. The contact via structures 80 may include first contact via structures 80A contacting a first subset of the at least two metallic electrode layers (10A, 10B, 20A, 20B) that constitutes a first node of the deep trench capacitor structure, and second contact via structures 80B contacting a second subset of the at least two metallic electrode layers (10A, 10B, 20A, 20B) that constitutes a second node of the deep trench capacitor structure.

The contact-level metallic structures (80, 84) may include a contact-level metallic enclosure structure 84, which may be a single continuous via structure having a generally annular shape and vertically extending through the first dielectric layer 70. In one embodiment, the contact-level metallic enclosure structure 84 may contact an annular top surface of the conductive metallic substrate enclosure structure 4. The contact-level metallic enclosure structure 84 may laterally surround the contact via structures 80.

Figure 8A:
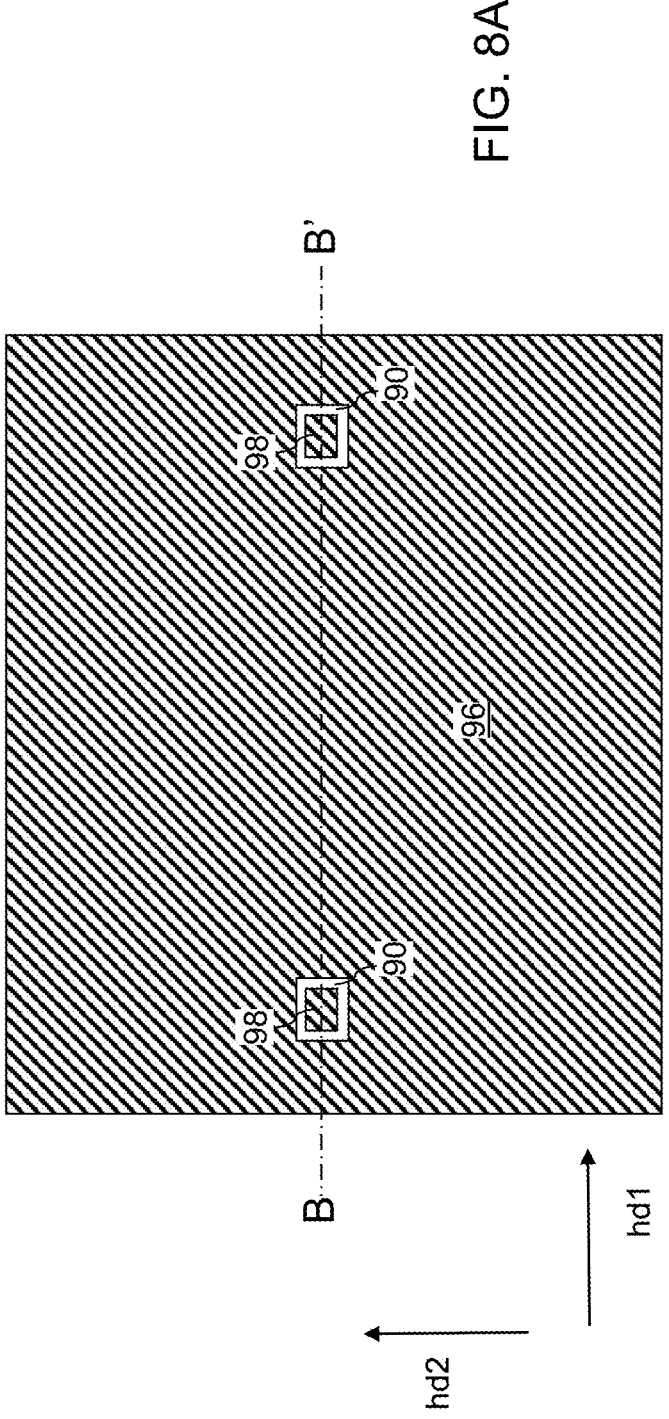
FIG. 8A is a top-down view of the exemplary structure after formation of additional dielectric material layers, a metallic interconnect enclosure structure, and a metallic cap plate according to an embodiment of the present disclosure.
Figure 8B:
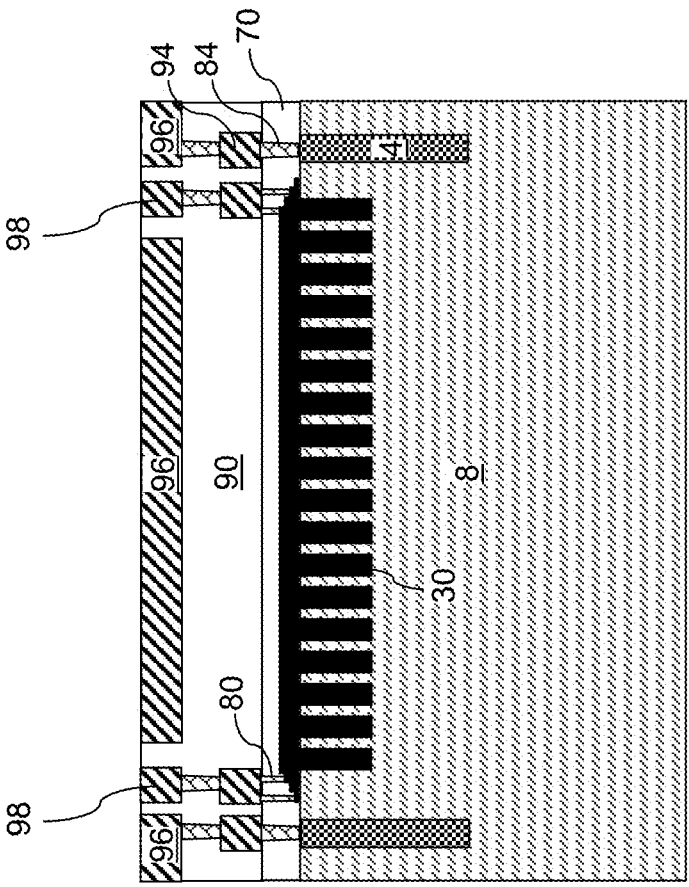
FIG. 8B is a vertical cross-sectional view of the exemplary structure along the vertical plane B-B' of FIG. 8A.

Referring to FIGS. 8A and 8B, additional dielectric material layers 90 and additional metal interconnect structures 98 may be formed over the first dielectric layer 70 and the contact-level metallic structures (80, 84). The additional dielectric material layers 90 may include at least one line-level dielectric material layer and/or at least one via-level dielectric material layer. The additional metal interconnect structures 98 may include metal line structures and metal via structures that are electrically connected to a respective one of the at least two metallic electrode layers (10A, 10B, 20A, 20B).

In one embodiment, the metal interconnect structures 98 may include first electrode interconnect structures electrically connected to a first subset of the at least two metallic electrode layers (10A, 10B, 20A, 20B) and embedded in the dielectric material layers 90, and a second electrode interconnect structure electrically connected to a second subset of the at least two metallic electrode layers (10A, 10B, 20A, 20B) and embedded in the dielectric material layers. In one embodiment, the first electrode interconnect structures comprise a first metal bonding pad formed at a topmost level of the metal interconnect structures 98, and a second metal bonding pad formed at a topmost level of the metal interconnect structures 98.

According to an aspect of the present disclosure, an interconnect-level enclosure structure 94 may be formed at the same level as the metal interconnect structures 98. The interconnect-level enclosure structure 94 may include at least one line-level enclosure structure and/or at least one via-level enclosure structure. Each of the at least one line-level enclosure structure and/or at least one via-level enclosure structure has a tubular configuration, and contacts an annular top surface of the contact-level metallic enclosure structure 84 or an annular top surface of a respective underlying one selected from the at least one line-level enclosure structure and/or at least one via-level enclosure structure.

The combination of the contact-level metallic enclosure structure 84 and the interconnect-level enclosure structure 94 constitutes a metallic interconnect enclosure structure (84, 94) that laterally surrounds the metal interconnect structure (80, 98). The metallic interconnect enclosure structure (84, 94) vertically extends from a horizontal plane including the front surface of the substrate 8 to a horizontal plane including a top surface of the dielectric material layer 90. The metallic interconnect enclosure structure (84, 94)

contacts an annular top surface of the conductive metallic substrate enclosure structure 4.

A metallic cap plate 96 may be formed at a topmost level of the dielectric material layers 90. The metallic cap plate 96 may be formed by depositing and patterning a metallic material layer. The metallic cap plate 96 may contact an annular top surface of the metallic interconnect enclosure structure (84, 94). The metallic cap plate 96 may include openings over areas of metal bonding pads that are a subset of the metal interconnect structures 98. For example, the metallic cap plate 96 may include openings over areas of the first metal bonding pad and the second metal bonding pad, which may be connected to a first subset of the metallic electrode layers (10A, 20A, 10B, 20B) and to a second subset of the metallic electrode layers (10A, 20A, 10B, 20B).

Figure 9:
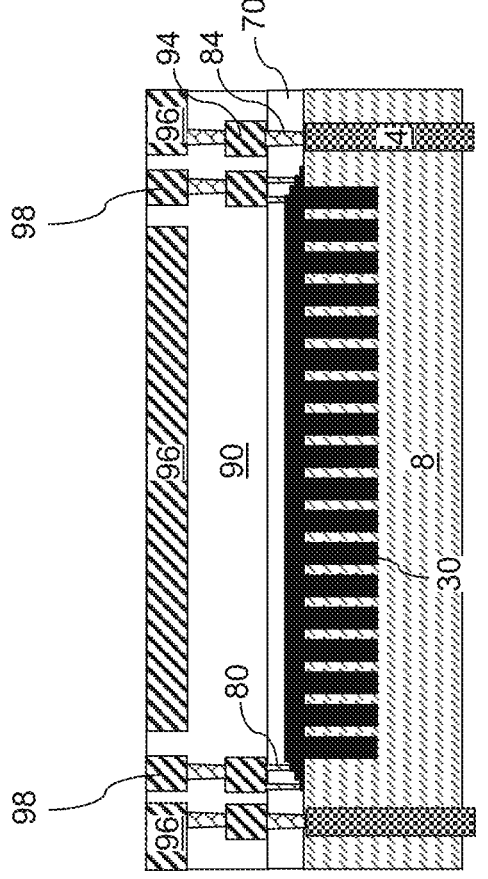
FIG. 9 is a vertical cross-sectional view of the exemplary structure after thinning the backside of the substrate according to an embodiment of the present disclosure.

Referring to FIG. 9, the substrate 8 may be subsequently thinned by removing a backside portion of the substrate 8. For example, the substrate 8 may be thinned by grinding, polishing, an anisotropic etch process, and/or an isotropic etch process. The substrate 8 may be thinned from the backside of the substrate 8 until an annular backside surface of the conductive metallic substrate enclosure structure 4 may be physically exposed.

Figure 10:
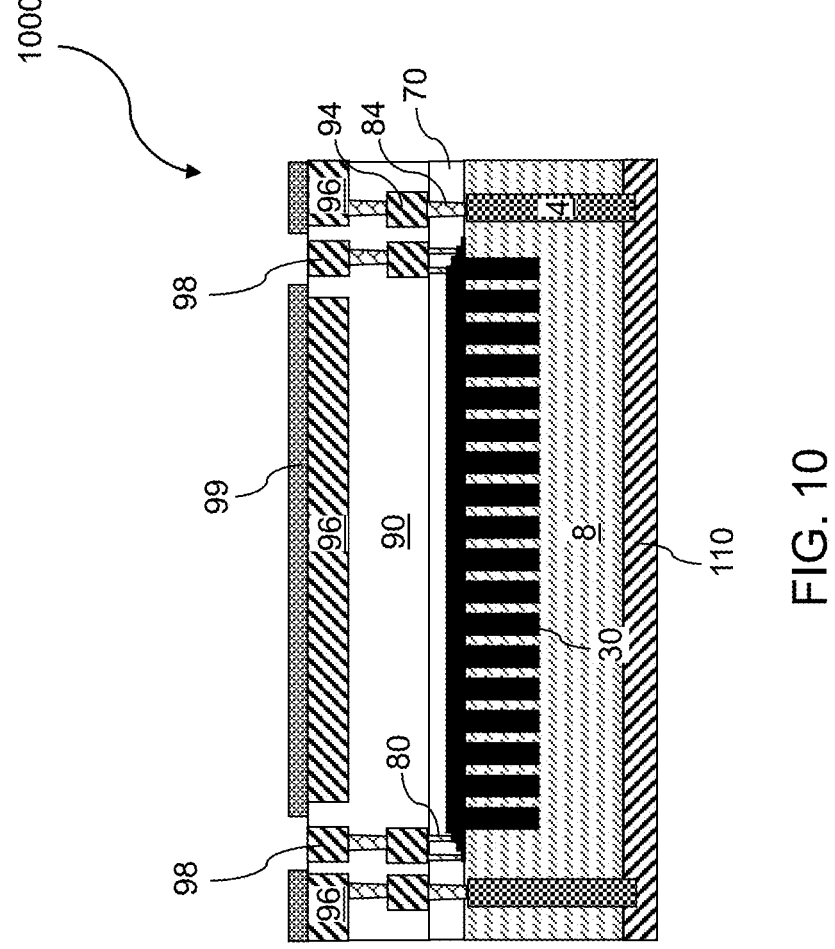
FIG. 10 is a vertical cross-sectional view of the exemplary structure after forming a backside metal layer according to an embodiment of the present disclosure.

Referring to FIG. 10, a backside metal layer 110 may be deposited on the backside surface of the substrate 8 and on the physically exposed annular backside surface of each conductive metallic substrate enclosure structure 4. For example, the exemplary structure may be disposed upside down in a metal deposition chamber, and the backside metal layer 110 may be deposited by physical vapor deposition or by chemical vapor deposition. The backside metal layer 110 may include at least one metallic nitride material (such as TiN, TaN, or WN), an elemental metal, and/or an intermetallic alloy material. In an illustrative example, the backside metal layer 110 may include a layer stack of a metallic nitride layer and a metal layer including Cu, Co, Ru, Mo, and/or W. The thickness of the backside metal layer 110 may be in a range from 100 nm to 5 microns, although lesser and greater thicknesses may also be used.

Generally, the backside metal layer 110 may be formed on the backside surface of the substrate 8 and the backside surface of each conductive metallic substrate enclosure structure 4. In one embodiment, the backside metal layer 110 may contact the entirety of the backside surface of the substrate 8 and the backside surface of each conductive metallic substrate enclosure structure 4.

A passivation dielectric layer 99 may be subsequently formed over the additional dielectric material layers 90 and additional metal interconnect structures 98. The passivation dielectric layer 99 may include a dielectric diffusion barrier material such as silicon nitride. The thickness of the passivation dielectric layer 99 may be in a range from 30 nm to 300 nm, although lesser and greater thicknesses may also be used. Openings may be formed through the passivation dielectric layer 99 over areas of the metallic bonding pads.

Subsequently, the exemplary structure may be diced into a plurality of semiconductor dies, each of which may comprise a capacitor die 1000. The dicing may be performed along dicing channels, which may be parallel to the first horizontal direction hd1 or the second horizontal direction hd2.

Within each capacitor die 1000, each contiguous combination of a conductive metallic substrate enclosure structure 4, a backside metal layer 110, a metallic interconnect enclosure structure (84, 94), and a metallic cap plate 96 constitutes a metallic shield structure (4, 110, 84, 94, 96)

configured to block electromagnetic radiation from imping-ing into the trench capacitor structure therein. In one embodiment, the metallic shield structure (4, 110, 84, 94, 96) does not include any opening other than the openings in the metallic cap plate 96. Thus, the metallic shield structure (4, 110, 84, 94, 96) may comprise a conductive metallic sub-strate enclosure structure 4 laterally surrounding the deep trenches 9, a backside metal layer 110 contacting the back-side surface of the substrate 8; a metallic cap plate 96 overlying at least one dielectric material layer 90; and a metallic interconnect enclosure structure (84, 94) vertically extending between the metallic cap plate 96 and the con-ductive metallic substrate enclosure structure 4.

Figure 11:
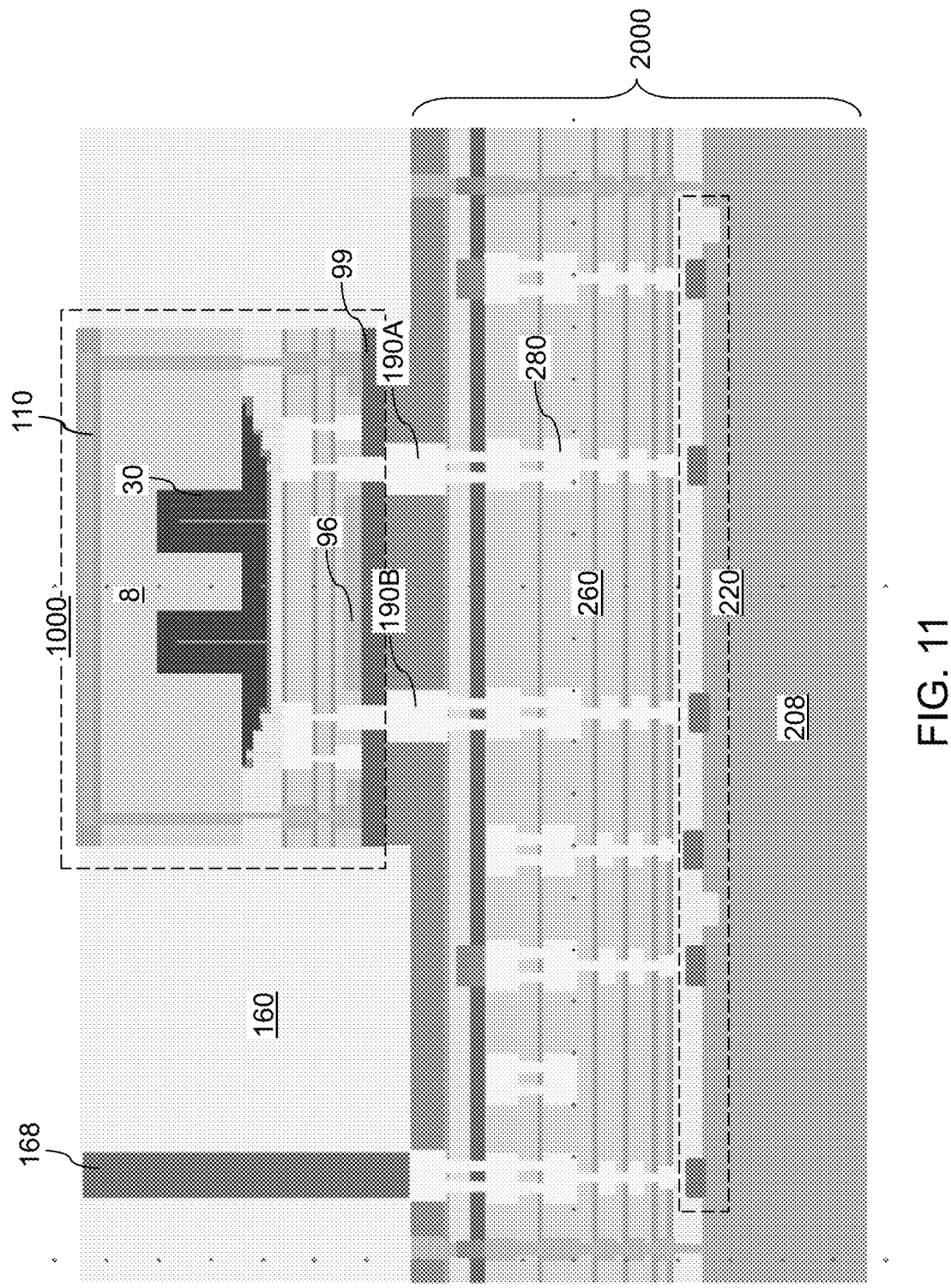
FIG. 11 is a vertical cross-sectional view of the exemplary structure after attaching a capacitor die to a semiconductor die and after formation of a dielectric matrix layer according to an embodiment of the present disclosure.

Referring to FIG. 11, a capacitor die 1000 may be attached to a semiconductor die 2000 including semiconductor devices 220 therein. In one embodiment, a two-dimensional array of semiconductor dies 2000 may be formed on a semiconductor wafer, and a two-dimensional array of capacitor dies 1000 may be attached to a respective one of the semiconductor dies 2000. Each semiconductor die 2000 may include a portion of a semiconductor substrate 208, which may be a single crystalline silicon substrate such as a single crystalline silicon substrate.

The semiconductor devices 220 may comprise any of the semiconductor devices known in the art. For example, the semiconductor devices 220 may include field effect transis-tors using a portion of the semiconductor substrate 208 or an epitaxially semiconductor material portion aligned to the single crystalline semiconductor material of the semicon-ductor substrate 208 as a channel region. The field effect transistors may be planar field effect transistors, fin field effect transistors, or gate-all-around (GAA) field effect tran-sistors. Each semiconductor die 2000 may include metal interconnect structures 280 embedded in dielectric material layers 260.

A first subset of the at least two metallic electrode layers (10A, 10B, 20A, 20B) may be electrically connected to a first node of semiconductor devices 220 within the semi-conductor die 2000. A second subset of the at least two metallic electrode layers (10A, 10B, 20A, 20B) may be electrically connected to a second node of the semiconductor devices 220 within the semiconductor die 2000. In one embodiment, the first subset of the at least two metallic electrode layers (10A, 10B, 20A, 20B) may be electrically connected to the first node of semiconductor devices 220 through a first metallic connection structure 190A that vertically extends through a first opening in the dielectric passivation layer 99 that is located between the metallic cap plate 96 and the semiconductor die 2000. The second subset of the at least two metallic electrode layers (10A, 10B, 20A, 20B) may be electrically connected to the second node of semiconductor devices 220 through a second metallic con-nection structure 190B that vertically extends through a second opening in the dielectric passivation layer 99 that is located between the metallic cap plate 96 and the semicon-ductor die 2000.

A dielectric matrix layer 160 may be formed over the semiconductor die 2000 around the capacitor die 1000. The dielectric matrix layer 160 may include a polymer molding compound. Excess portions of the dielectric matrix layer 160 may be removed from above the horizontal plane including the physically exposed surface of the backside metal layer 110 by a planarization process such as a chemi-cal mechanical planarization process or a recess etch pro-cess. The dielectric matrix layer 160 may laterally surround each capacitor die 1000.

At least one through-dielectric via structure 168 may be formed through the dielectric matrix layer 160 on a respec-tive one of the metal interconnect structures 280 within the semiconductor dies 2000.

Figure 12:
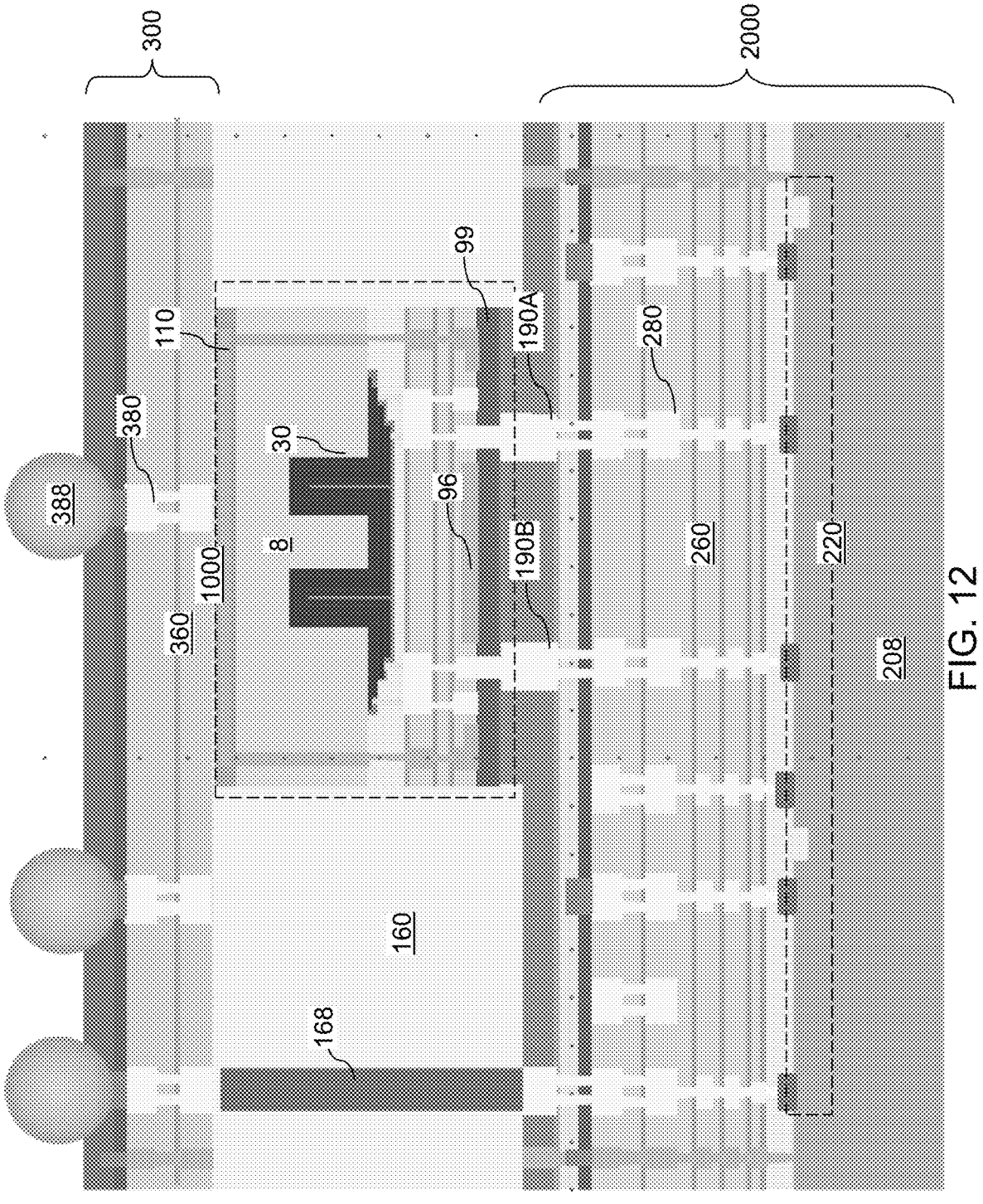
FIG. 12 is a vertical cross-sectional view of the exemplary structure after formation of a redistribution interconnect assembly and an array of solder balls according to an embodiment of the present disclosure.

Referring to FIG. 12, a redistribution interconnect assem-bly 300 may be formed over the array of capacitor dies 1000 and the dielectric matrix layer 160. The redistribution inter-connect assembly 300 may include redistribution metal interconnect structures 380 embedded in redistribution dielectric material layers 360. In one embodiment, each backside metal layer 110 may be contacted by a respective one of the redistribution metal interconnect structures 380.

An array of solder balls 388 may be attached to a subset of the redistribution metal interconnect structures 380. Each backside metal layer 110 may be electrically connected to a respective one of the solder balls 388 through a respective subset of the redistribution metal interconnect structures 380. In one embodiment, the through-dielectric via struc-tures 168 may vertically extend through the dielectric matrix layer 160, and may electrically connect a respective one of the redistribution metal interconnect structures to a node of a semiconductor device 220 within the semiconductor die 2000.

Referring collectively to FIGS. 1A-12 and according to various embodiments of the present disclosure, a semicon-ductor structure comprising a capacitor die 1000 is provided. The capacitor die 1000 comprises: deep trenches 9 extend-ing downward from a front surface of a substrate 8 toward a backside surface of the substrate 8; a trench capacitor structure comprising a layer stack including at least two metallic electrode layers (10A, 10B, 20A, 20B) interlaced with at least one node dielectric layer 15, wherein each layer within the layer stack (10A, 10B, 20A, 20B) comprises a horizontally-extending portion that overlies a front surface of the substrate 8 and vertically-extending portions located within a respective one of the deep trenches 9; a conductive metallic substrate enclosure structure 4 laterally surrounding the deep trenches 9 and vertically extending from the front surface of the substrate 8 to the backside surface of the substrate 8; and a backside metal layer 110 contacting a backside surface of the conductive metallic substrate enclo-sure structure 4.

In one embodiment, the semiconductor structure com-prises: at least one dielectric material layer (70, 90) located over the front surface of the substrate 8; and a metallic interconnect enclosure structure (84, 94) embedded in the at least one dielectric material layer (70, 90) and contacting the conductive metallic substrate enclosure structure 4.

In one embodiment, a metallic cap plate 96 may overlie and contact the metallic interconnect enclosure structure (84, 94), and may include openings therethrough. In one embodiment, an interface between the backside metal layer 110 and the substrate 8 continuously extends within an interface between the conductive metallic substrate enclo-sure structure 4 and the backside metal layer 110 without any opening through the interface between the backside metal layer 110 and the substrate 8. In one embodiment, the conductive metallic substrate enclosure structure 4 may be free of any lateral opening between the horizontal plane including a front surface of the substrate 8 (which contacts the first dielectric material layer 70) and the horizontal plane including the backside surface of the substrate 8 (that contacts the backside metal layer 110). In one embodiment, the contact the metallic interconnect enclosure structure (84, 94) may be free of any lateral opening between the hori-zontal plane including an interface with the conductive metallic substrate enclosure structure 4 and a horizontal plane including a topmost surface of the contact the metallic interconnect enclosure structure (84, 94). In one embodiment, the semiconductor structure may comprise: a first electrode interconnect structure (which is a first subset of the metal interconnect structures 98) electrically connected to a first subset of the at least two metallic electrode layers (10A, 10B, 20A, 20B) and embedded in the at least one dielectric material layer (70, 90); and a second electrode interconnect structure (which is a second subset of the metal interconnect structures 98) electrically connected to a second subset of the at least two metallic electrode layers (10A, 10B, 20A, 20B) and embedded in the at least one dielectric material layer (70, 90). In one embodiment, the first electrode interconnect structure comprises a first metal bonding pad; the second electrode interconnect structure comprises a second metal bonding pad; and the metallic cap plate 96 comprises a pair of openings within areas of the first metal bonding pad and the second metal bonding pad.

In one embodiment, a combination of the conductive metallic substrate enclosure structure 4, the metallic interconnect enclosure structure (84, 94), the backside metal layer 110, and the metallic cap plate 96 constitutes a metallic shield structure (4, 110, 84, 94, 96) that blocks electromagnetic radiation from the trench capacitor structure.

In one embodiment, the semiconductor structure comprises a semiconductor die 2000 attached to the capacitor die 1000. A first subset of the at least two metallic electrode layers (10A, 10B, 20A, 20B) is electrically connected to a first node of semiconductor devices 220 within the semiconductor die 2000; and a second subset of the at least two metallic electrode layers (10A, 10B, 20A, 20B) is electrically connected to a second node of the semiconductor devices 220 within the semiconductor die 2000. In one embodiment, the first subset of the at least two metallic electrode layers (10A, 10B, 20A, 20B) is electrically connected to the first node of semiconductor devices 220 through a first metallic connection structure 190A that vertically extends through a first opening in a passivation dielectric layer 99 located between the metallic cap plate 96 and the semiconductor die 2000; and the second subset of the at least two metallic electrode layers (10A, 10B, 20A, 20B) is electrically connected to the second node of semiconductor devices 220 through a second metallic connection structure 190B that vertically extends through a second opening in the passivation dielectric layer 99.

In one embodiment, the semiconductor structure comprises: a dielectric matrix layer 160 located on the semiconductor die 2000 and laterally surrounding the capacitor die 1000; and a redistribution interconnect assembly 300 including redistribution metal interconnect structures 380 embedded in redistribution dielectric material layers 360 and located on the capacitor die 1000 and the dielectric matrix layer 160. In one embodiment, one of the redistribution metal interconnect structures 380 contacts the backside metal layer 110. In one embodiment, the semiconductor structure comprises an array of solder balls 388 attached to a subset of the redistribution metal interconnect structures 380. The backside metal layer 110 is electrically connected to one of the solder balls 388 through the one of the redistribution metal interconnect structures 380. In one embodiment, the semiconductor structure comprises at least one through-dielectric via structure 168 vertically extending through the dielectric matrix layer 160 and electrically connecting a respective one of the redistribution metal interconnect structures 380 to a node of a semiconductor device 220 within the semiconductor die 2000.

According to an aspect of the present disclosure, a capacitor die 1000 is provided, which comprises: deep trenches 9 extending downward from a front surface of a substrate 8 toward a backside surface of the substrate 8; a trench capacitor structure comprising a layer stack including at least two metallic electrode layers (10A, 10B, 20A, 20B) interlaced with at least one node dielectric layer 15, wherein each layer within the layer stack comprises a horizontally-extending portion that overlies a front surface of the substrate 8 and vertically-extending portions located within a respective one of the deep trenches 9; at least one dielectric material layer (70, 90) located over the front surface of the substrate 8; and a metallic shield structure (4, 110, 84, 94, 96) configured to block electromagnetic radiation from impinging into the trench capacitor structure, wherein the metallic shield structure (4, 110, 84, 94, 96) comprises: a conductive metallic substrate enclosure structure 4 laterally surrounding the deep trenches 9; a backside metal layer 110 contacting the backside surface of the substrate 8; a metallic cap plate 96 overlying the at least one dielectric material layer (70, 90); and a metallic interconnect enclosure structure (84, 94) vertically extending through the at least one dielectric material layer (70, 90) between the metallic cap plate 96 and the conductive metallic substrate enclosure structure 4.

In one embodiment, the metallic cap plate 96 comprises openings therethrough. In one embodiment, the capacitor die 1000 comprises: a first electrode interconnect structure (which is a first subset of the metal interconnect structures 98) electrically connected to a first subset of the at least two metallic electrode layers (10A, 10B, 20A, 20B) and embedded in the at least one dielectric material layer (70, 90) and comprising a first metal bonding pad; and a second electrode interconnect structure (which is a second subset of the metal interconnect structures 98) electrically connected to a second subset of the at least two metallic electrode layers (10A, 10B, 20A, 20B) and embedded in the at least one dielectric material layer (70, 90) and comprising a second metal bonding pad. Openings in the metallic cap plate 96 are located over or underneath areas of the first metal bonding pad and the second metal bonding pad.

Referring to FIG. 13, a flowchart illustrates general processing steps for forming a semiconductor structure including a capacitor die 1000. Referring to step 1310 and FIGS. 1A and 1B, a moat trench 3 laterally surrounding a device region in a substrate 8 may be formed. Referring to step 1320 and FIGS. 2A and 2B, a conductive metallic substrate enclosure structure 4 may be formed in the moat trench 3. Referring to step 1330 and FIGS. 3A and 3B, deep trenches 9 may be formed in the substrate 8. Referring to step 1340 and FIGS. 4-8B, a trench capacitor structure may be formed in the deep trenches 9. The trench capacitor structure comprises a layer stack including at least two metallic electrode layers (10A, 10B, 20A, 20B) interlaced with at least one node dielectric layer 15. Referring step 1350 and FIG. 9, the substrate 8 may be thinned by removing a backside portion of the substrate 8. A backside surface of the conductive metallic substrate enclosure structure 4 is physically exposed. Referring to step 1360 and FIG. 10, a backside metal layer 110 may be formed on a backside surface of the substrate 8 and a backside surface of the conductive metallic substrate enclosure structure 4.

The various embodiments of the present disclosure may be used to provide a capacitor die 1000 that provides electromagnetic shielding to the trench capacitor structure therein. A metallic shield structure (4, 110, 84, 94, 96) may encapsulate a deep trench capacitor structure such that openings are formed only through the metallic cap plate 96. A conductive metallic substrate enclosure structure 4, a backside metal layer 110, and a metallic interconnect enclosure structure (84, 94) may be free of any opening. The metallic shield structure (4, 110, 84, 94, 96) reduces or eliminates electromagnetic interference to the deep trench capacitor from external electromagnetic radiation, and enhanced performance of the capacitor die 1000 and a semiconductor die 2000 that is electrically connected to the capacitor die 1000.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:

forming a moat trench laterally surrounding a device region in a substrate;

forming a conductive metallic substrate enclosure structure in the moat trench;

forming deep trenches in the substrate;

forming a trench capacitor structure comprising a layer stack including at least two metallic electrode layers interlaced with at least one node dielectric layer in the deep trenches;

forming a backside metal layer on a backside of the trench capacitor structure;

forming a capacitor die by dicing an assembly comprising the backside metal layer and the substrate, wherein the capacitor die comprises the trench capacitor structure, a diced portion of the substrate, a diced portion of the backside metal layer, and the conductive metallic substrate enclosure structure;

attaching the capacitor die to a semiconductor die including semiconductor devices therein;

forming a dielectric matrix layer around the capacitor die and over the semiconductor die; and forming a redistribution interconnect assembly including redistribution metal interconnect structures formed within redistribution dielectric material layers over a combination of the capacitor die and the dielectric matrix layer.

2. The method of claim 1, further comprising forming a metallic shield structure configured to block electromagnetic radiation from impinging into the trench capacitor structure, wherein the metallic shield structure comprises:

the conductive metallic substrate enclosure structure;

the backside metal layer;

a metallic interconnect enclosure structure that overlies the trench capacitor structure and laterally surrounds an entirety of an area of the trench capacitor structure in an plan view; and a metallic cap plate that overlies the area of the trench capacitor structure and adjoined to a top surface of the metallic interconnect enclosure structure.

3. The method of claim 1, further comprising attaching an array of solder balls to a subset of the redistribution metal interconnect structures, wherein the backside metal layer is electrically connected to one of the solder balls through a subset of the redistribution metal interconnect structures.

4. The method of claim 1, wherein:

the capacitor die comprises the substrate, the trench capacitor structure, the conductive metallic substrate enclosure structure, and the backside metal layer;

after attaching the capacitor die to the semiconductor die, a first subset of the at least two metallic electrode layers of the trench capacitor structure is electrically connected to a first node of semiconductor devices within the semiconductor die, and a second subset of the at least two metallic electrode layers of the trench capacitor structure is electrically connected to a second node of the semiconductor devices within the semiconductor die that is different from the first node; and the first node comprises a first power-supply node of the semiconductor devices and the second node comprises a second power-supply node of the semiconductor devices that is different from the first power-supply node.

5. The method of claim 4, wherein:

the dielectric matrix layer is located around the capacitor die and over the semiconductor die, and wherein the redistribution interconnect assembly includes redistribution metal interconnect structures formed within redistribution dielectric material layers over a combination of the capacitor die and the dielectric matrix layer; and the dielectric matrix layer comprises a polymer molding compound and has a planarized top surface that is coplanar with a physically exposed surface of the backside metal layer of the capacitor die.

6. The method of claim 5, wherein one of the redistribution metal interconnect structures is electrically connected to the backside metal layer through a corresponding portion of the redistribution dielectric material layers.

7. The method of claim 6, wherein the semiconductor structure further comprises at least one through-dielectric via structure vertically extending through the dielectric matrix layer and electrically connecting a respective one of the redistribution metal interconnect structures to a node of a semiconductor device within the semiconductor die.

8. The method of claim 1, further comprising forming a metallic shield structure configured to block electromagnetic radiation from impinging into the trench capacitor structure, wherein the metallic shield structure comprises:

the conductive metallic substrate enclosure structure; and the backside metal layer, the backside metal layer being disposed underneath the trench capacitor structure and contacting a bottom surface of the conductive metallic substrate enclosure structure and continuously covering an entire area that is laterally surrounded by the conductive metallic substrate enclosure structure without any opening therethrough.

9. The method of claim 8, wherein the metallic shield structure further comprises:

a metallic interconnect enclosure structure that overlies the trench capacitor structure and laterally surrounds an entirety of an area of the trench capacitor structure in a plan view and is free of any lateral opening therethrough; and a metallic cap plate that overlies the area of the trench capacitor structure and is adjoined to a top surface of the metallic interconnect enclosure structure, wherein the conductive metallic substrate enclosure structure, the backside metal layer, the metallic interconnect enclosure structure, and the metallic cap plate together form a continuous conductive enclosure around the trench capacitor structure in three dimensions except at metal bonding pad openings.

10. The method of claim 9, further comprising:

forming at least one dielectric material layer located over a front surface of the substrate;

forming a first electrode interconnect structure electrically connected to a first subset of the at least two metallic electrode layers in the at least one dielectric material layer; and forming a second electrode interconnect structure electrically connected to a second subset of the at least two metallic electrode layers and embedded in the at least one dielectric material layer, wherein the first electrode interconnect structure comprises a first metal bonding pad that is located within the metallic interconnect enclosure structure, wherein the second electrode interconnect structure comprises a second metal bonding pad that is located within the metallic interconnect enclosure structure, and wherein the metallic cap plate includes a first opening overlying the first metal bonding pad and a second opening overlying the second metal bonding pad, and the metallic cap plate is free of any other opening overlying the trench capacitor structure.

11. The method of claim 1, wherein:

the conductive metallic substrate enclosure structure is formed such that the conductive metallic substrate enclosure structure vertically extends from the front surface of the substrate to the backside surface of the substrate and has a greater depth than the trench capacitor structure, and continuously interfaces with the substrate without any discontinuity along an entire vertical interface between the conductive metallic substrate enclosure structure and the substrate; and the conductive metallic substrate enclosure structure comprises a metallic nitride liner disposed along sidewalls of the moat trench and a metallic fill material that fills a remaining volume of the moat trench, the conductive metallic substrate enclosure structure having an electrical conductivity of at least $1 \times 10^5$ S/cm.

12. A method of forming a semiconductor structure, the method comprising:

forming deep trenches extending downward from a front surface of a substrate toward a backside surface of the substrate;

forming a trench capacitor structure comprising a layer stack including at least two metallic electrode layers interlaced with at least one node dielectric layer in, and over, the deep trenches;

forming a conductive metallic substrate enclosure structure laterally surrounding the deep trenches, wherein the conductive metallic substrate enclosure structure is free of any lateral opening therethrough;

exposing a backside surface of the conductive metallic substrate enclosure structure by thinning a backside of the substrate;

forming a backside metal layer on the backside surface of the conductive metallic substrate enclosure structure;

forming a capacitor die by dicing an assembly comprising the backside metal layer and the substrate;

attaching the capacitor die to a semiconductor die including semiconductor devices therein such that such that a first subset of the at least two metallic electrode layers is electrically connected to a first node of semiconductor devices within the semiconductor die and a second subset of the at least two metallic electrode layers is electrically connected to a second node of the semiconductor devices within the semiconductor die;

forming a dielectric matrix layer around the capacitor die and over the semiconductor die; and forming a redistribution interconnect assembly including redistribution metal interconnect structures formed within redistribution dielectric material layers on the backside metal layer and the dielectric matrix layer.

13. The method of claim 12, further comprising:

forming at least one dielectric material layer located over the front surface of the substrate; and forming a metallic interconnect enclosure structure embedded in the at least one dielectric material layer and contacting the conductive metallic substrate enclosure structure, wherein the metallic interconnect enclosure structure is free of any lateral opening and laterally encloses an entire area of the trench capacitor structure in a plan view.

14. The method of claim 13, further comprising forming a metallic cap plate over the metallic interconnect enclosure structure, wherein the metallic cap plate laterally extends over the entire area of the trench capacitor structure in the plan view and includes openings therethrough.

15. The method of claim 14, further comprising:

forming a first electrode interconnect structure electrically connected to a first subset of the at least two metallic electrode layers in the at least one dielectric material layer; and forming a second electrode interconnect structure electrically connected to a second subset of the at least two metallic electrode layers and embedded in the at least one dielectric material layer.

16. The method of claim 15, wherein:

the first electrode interconnect structure comprises a first metal bonding pad;

the second electrode interconnect structure comprises a second metal bonding pad; and the metallic cap plate comprises a pair of openings within areas of the first metal bonding pad and the second metal bonding pad.

17. The method of claim 12, wherein the capacitor die includes a combination of the substrate, the trench capacitor structure, the conductive metallic substrate enclosure structure, and the backside metal layer.

18. A method of forming a semiconductor structure, the method comprising:

forming deep trenches extending downward from a front surface of a substrate toward a backside surface of the substrate;

forming a trench capacitor structure comprising a layer stack including at least two metallic electrode layers interlaced with at least one node dielectric layer in, and over, the deep trenches, wherein each layer within the layer stack comprises a horizontally-extending portion that overlies a front surface of the substrate and vertically-extending portions located within a respective one of the deep trenches;

forming a conductive metallic substrate enclosure structure laterally surrounding the deep trenches and vertically extending from the front surface of the substrate to the backside surface of the substrate and having a greater depth than the trench capacitor structure;

forming first metallic interconnect structures embedded in dielectric material layers and electrically connected to a respective one of the at least two metallic electrode layers;

forming a metallic interconnect enclosure structure laterally surrounding the first metallic interconnect structures and free of any lateral opening therein;

forming a metallic cap plate overlying and contacting the metallic interconnect enclosure structure and including openings therethrough;

forming a capacitor die by dicing an assembly comprising the substrate and the metallic interconnect enclosure structure;

attaching the capacitor die to a semiconductor die including semiconductor devices therein such that electrical nodes of the trench capacitor structure are electrically connected to electrical nodes of the semiconductor dies through a subset of metal interconnect structures extending through the openings in the metallic cap plate;

forming a dielectric matrix layer around the capacitor die and over the semiconductor die; and forming a redistribution interconnect assembly including redistribution metal interconnect structures formed within redistribution dielectric material layers over a combination of the capacitor die and the dielectric matrix layer.

19. The method of claim 18, further comprising:

physically exposing a backside surface of the conductive metallic substrate enclosure structure by thinning a backside of the substrate; and forming a backside metal layer contacting the backside surface of the conductive metallic substrate enclosure structure, wherein the backside metal layer continuously extends over an entire area that is laterally surrounded by the conductive metallic substrate enclosure structure without any opening therethrough.

20. The method of claim 18, wherein the conductive metallic substrate enclosure structure is in contact with, and is electrically shorted to, a semiconductor material of the substrate.

* * * * *